United States Patent
Koch et al.

(10) Patent No.: US 12,395,166 B2
(45) Date of Patent: Aug. 19, 2025

(54) SENSOR COMMUNICATION DISCRETE CONTROL CONSIDERING EMC COMPLIANCE FOR RESTRAINT CONTROL MODULE

(71) Applicant: VEONEER US, INC., Southfield, MI (US)

(72) Inventors: Stuart Koch, Southfield, MI (US); Vincent Colarossi, Southfield, MI (US); Nick Hunt, Southfield, MI (US); Michael Campbell, Southfield, MI (US); Grant Scott, Southfield, MI (US)

(73) Assignee: VEONEER US SAFETY SYSTEMS, LLC, Southfield, MI (US)

( * ) Notice: Subject to any disclaimer, the term of this patent is extended or adjusted under 35 U.S.C. 154(b) by 535 days.

(21) Appl. No.: 16/892,830

(22) Filed: Jun. 4, 2020

(65) Prior Publication Data

US 2021/0380060 A1 Dec. 9, 2021

(51) Int. Cl.
 *H03K 17/16* (2006.01)
 *B60R 21/015* (2006.01)
 (Continued)

(52) U.S. Cl.
 CPC ....... *H03K 17/16* (2013.01); *B60R 21/01554* (2014.10); *H04L 12/40* (2013.01);
 (Continued)

(58) Field of Classification Search
 CPC ... H03K 17/16; B60R 21/01554; H04L 12/40; H04L 67/12; H04L 2012/40273; H04Q 9/00
 See application file for complete search history.

(56) References Cited

U.S. PATENT DOCUMENTS 6,522,179 B2 * 2/2003 Ferianz ............... H03F 3/45475
 327/108
7,760,006 B2 * 7/2010 Lavery ............. H03K 19/00384
 326/82
(Continued)

FOREIGN PATENT DOCUMENTS

EP 2129047 A1 * 12/2009 ....... H04L 12/40045
JP H10501337 A * 2/1998
(Continued)

OTHER PUBLICATIONS

Article entitled "Peripheral Sensor Interface 5"; retrieved from Wikipedia Feb. 20, 2020; https://en.wikipedia.org/wiki/Peripheral_Sensor_Interface_5.
(Continued)

*Primary Examiner* — Lincoln D Donovan
*Assistant Examiner* — James G Yeaman
(74) *Attorney, Agent, or Firm* — DICKINSON WRIGHT PLLC (57) ABSTRACT

An electronic control unit for a restraint control module comprises a PSI5 communications interface configured to communicate with a remote sensor using a current-modulated signal with PSI5 compliance upon a two-wire interconnection. The PSI5 communications interface includes a signal driver configured to apply a signal voltage to a first signal terminal for driving current to the remote sensor via the two-wire interconnection. The PSI5 communications interface also includes a second signal terminal providing a return path for the current; and a resistor within the return path of the PSI5 communications interface. Several different alternative impedance balancing and damping circuits are provided to provide the resistor. The alternative impedance balancing and damping circuits include passive and active resistors. The impedance balancing and damping circuit may also provide current protection against damage due to fault (Continued)

currents. A method for operating a PSI5 communications interface of a restraint control module is also provided.

16 Claims, 4 Drawing Sheets (51) Int. Cl.
*H04L 12/40* (2006.01)
*H04L 67/12* (2022.01)
*H04Q 9/00* (2006.01)

(52) U.S. Cl.
CPC .............. *H04L 67/12* (2013.01); *H04Q 9/00* (2013.01); *H04L 2012/40273* (2013.01)

(56) References Cited

U.S. PATENT DOCUMENTS

| | | | | |
|---|---|---|---|---|
| 7,888,952 | B2* | 2/2011 | Franke | G01R 17/06 324/750.16 |
| 9,292,409 | B2* | 3/2016 | Hammerschmidt | B60R 21/01 |
| 10,090,689 | B2* | 10/2018 | Pan | H02J 7/00304 |
| 10,153,766 | B2* | 12/2018 | Mauder | H01L 24/48 |
| 10,439,600 | B1* | 10/2019 | Eggermont | H03K 4/00 |
| 10,604,095 | B2* | 3/2020 | Colarossi | H04L 25/0272 |
| 2005/0110476 | A1* | 5/2005 | Mukherjee | G05F 3/30 323/313 |
| 2007/0075748 | A1* | 4/2007 | Bhattacharya | H03K 19/00315 327/74 |
| 2012/0280839 | A1* | 11/2012 | Fan | H03M 9/00 341/101 |
| 2012/0326790 | A1* | 12/2012 | Stochino | H03F 1/3229 330/293 |
| 2013/0257510 | A1* | 10/2013 | Suzaki | H03K 17/04123 327/374 |
| 2014/0358377 | A1 | 12/2014 | Hammerschmidt et al. | |
| 2017/0163366 | A1 | 6/2017 | Aichriedler et al. | |
| 2018/0170298 | A1* | 6/2018 | Sakai | G01P 15/0891 |
| 2019/0305724 | A1 | 10/2019 | Colarossi et al. | |
| 2020/0169284 | A1 | 5/2020 | Easwaran et al. | |

FOREIGN PATENT DOCUMENTS

| | | | | |
|---|---|---|---|---|
| JP | | H11511588 A | * 10/1999 | |
| WO | WO-2018168282 A1 | * 9/2018 | | H01F 17/04 |

OTHER PUBLICATIONS

International Search Report issued in corresponding PCT App. No. PCT/US2021/035605, mailed Sep. 9, 2021.

* cited by examiner

SENSOR COMMUNICATION DISCRETE CONTROL CONSIDERING EMC COMPLIANCE FOR RESTRAINT CONTROL MODULE

BACKGROUND

Enhancements in automotive safety systems over the past several decades have provided dramatic improvements in vehicle occupant protection. Presently available motor vehicles include an array of such systems, including inflatable restraint systems for protection of occupants from frontal impacts, side impacts, and roll-over conditions. Advancements in restraint belts and vehicle interior energy absorbing systems have also contributed to enhancements in safety. Many of these systems must be deployed or actuated in a non-reversible manner upon the detection of a vehicle impact to provide their beneficial effect. Many designs for such sensors are presently used to detect the presence of an impact or roll-over condition as it occurs.

PSI5 communication interfaces are used in many different applications including restraint control modules for communicating with various sensors in a vehicle. PSI5 communication interfaces employ a two-wire interconnection with modulation of current for transmission of data. Conventional PSI5 implementations are unbalanced, with one wire held at a ground potential and a varying voltage on the other wire due to the current modulation. High-amplitude, high-speed unbalanced signals can generate unwanted electromagnetic interference (EMI), emissions from the sensor wires, which can cause a controller featuring such PSI5 communications interfaces to fail original equipment manufacturer (OEM) electromagnetic compatibility (EMC) tests.

SUMMARY

According to one or more embodiments, an electronic control unit comprises a PSI5 communications interface configured to communicate with a remote sensor using a current-modulated signal with PSI5 compliance upon a two-wire interconnection. The PSI5 communications interface includes a signal driver configured to apply a signal voltage to a first signal terminal for driving current to the remote sensor via the two-wire interconnection. The PSI5 communications interface also includes a second signal terminal providing a return path for the current, and a resistor within the return path of the PSI5 communications interface.

According to one or more embodiments, a method for operating a PSI5 communications interface of an electronic control unit is provided. The method comprises the steps of: applying a signal voltage to a first signal terminal of the PSI5 communications interface to drive a signal current to a remote sensor via a two-wire interconnection; receiving the signal current from the remote sensor by a second signal terminal of the PSI5 communications interface providing a return path for the signal current; and inducing a balance voltage upon the second signal terminal by a resistor within the return path.

The system and method of the present disclosure can provide a balanced signal upon the PSI5 communications interface, which can reduce generated electromagnetic interference (EMI) and improve performance on electromagnetic compatibility (EMC) tests.

These and other advantages and features will become more apparent from the following description taken in conjunction with the drawings.

BRIEF DESCRIPTION OF THE DRAWINGS

The subject matter of the present disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Referring now to the figures, where the present disclosure will be described with reference to specific embodiments, without limiting the same, it is to be understood that the disclosed embodiments are merely illustrative of the present disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

As used herein the term 'controller' refers to one or more processing circuits such as an application specific integrated circuit (ASIC), an electronic circuit, a processor (shared, dedicated, or group) and memory that executes one or more software or firmware programs, a combinational logic circuit, and/or other suitable components that provide the described functionality. As can be appreciated, the controllers described below can be combined and/or further partitioned.

Referring now to the figures, where the technical solutions will be described with reference to specific embodiments, without limiting same, for implementation of the disclosed embodiments.

Figure 1A:
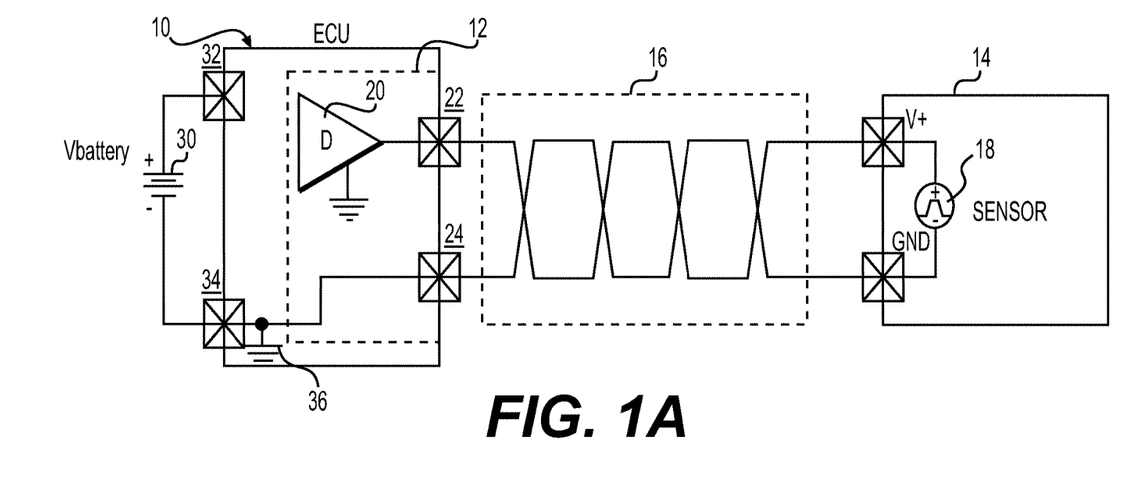
FIG. 1A is a schematic block diagram showing an electronic control unit (ECU) that includes a conventional PSI5 communications interface.

FIG. 1A is a schematic block diagram showing a first electronic control unit (ECU) 10. The first ECU 10 includes a first PSI5 communications interface 12 that is configured to communicate with a remote sensor 14 using a current-modulated signal upon a two-wire interconnection 16. More specifically, the first PSI5 communications interface 12 uses the Peripheral Sensor Interface 5 (PSI5) standard. PSI5 is a digital interface standard for sensors that employs a two-wire interconnection. PSI5 employs modulation of the sending current for the transmission of data on the power supply lines. PSI5 is used to connect peripheral sensors to electronic control devices in a number of different automotive systems. PSI5 supports both point-to-point and bus configurations, with asynchronous and synchronous communication. The terms PSI5 compliance and PSI5 timing compliance, as used in the present disclosure, includes both timing and electrical characteristics of the currents, such as different current values for synchronization and for data transmission. The terms PSI5 compliance and PSI5 timing compliance, as used in the present disclosure, includes balanced signals and related hardware that produces balanced signals.

The first ECU 10 may be used in a restraint control module to monitor and/or control sensors and/or actuators in a restraint system of a motor vehicle. The first ECU 10 may be used in other applications, such as in an engine control module (ECM), body control module (BCM), powertrain control module (PCM), etc.

The remote sensor 14 includes a current modulator 18 to modulate current on the two-wire interconnection 16, and to thereby communicate with the first ECU 10. The two-wire interconnection 16 may include a twisted pair wire having two current-carrying conductors. The two-wire interconnection 16 may be shielded or unshielded. The first PSI5 communications interface 12 includes a signal driver 20 configured to apply a signal voltage to a first signal terminal 22 for driving current to the remote sensor 14 via the two-wire interconnection 16. The first PSI5 communications interface 12 also includes a second signal terminal 24 coupled to the two-wire interconnection 16 to provide a return path for the current.

The first ECU 10 is powered by a battery 30 having a battery voltage Vbattery, which is connected between a positive power terminal 32 and a negative power terminal 34. The negative battery terminal 36 is coupled to a chassis ground 36. The chassis ground 36 is shown inside the first ECU 10, however, the physical ground wire may be connected elsewhere. For example, the chassis ground 36 may be connected to a negative terminal of the battery 30 at or near the battery. The second signal terminal 24 is coupled to the chassis ground 36 in the first ECU 10, thus holding the second signal terminal 24 and the corresponding wire of the two-wire interconnection 16 at a constant 0V potential.

Figure 1B:
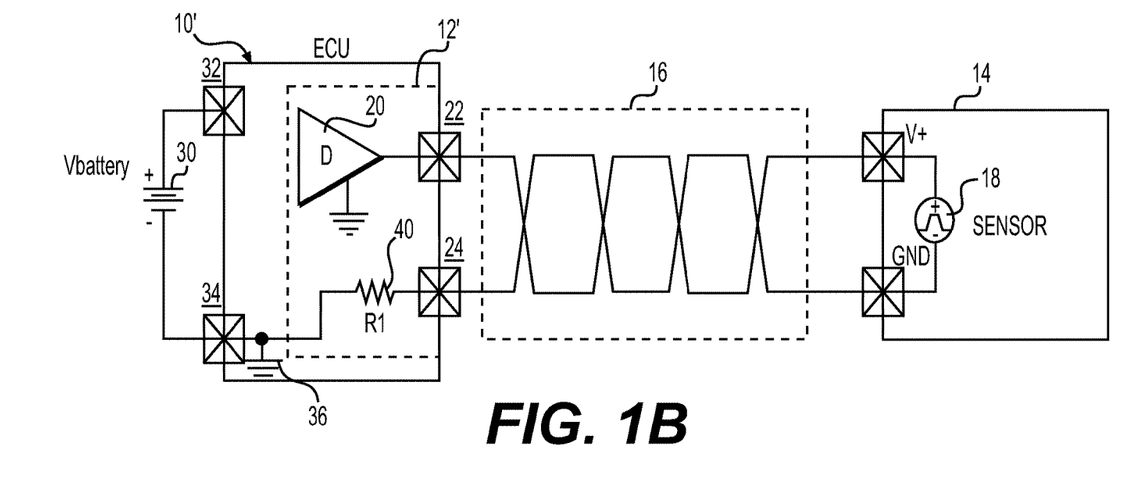
FIG. 1B is a schematic block diagram showing an ECU that includes a PSI5 communications interface according to aspects of the present disclosure.

FIG. 1B is a schematic block diagram showing a second electronic control unit (ECU) 10'. The second ECU 10' includes a second PSI5 communications interface 12' that is configured to communicate with a remote sensor 14 using a current-modulated signal upon a two-wire interconnection 16. The second ECU 10' may be similar or identical in form and function to the first ECU 10, except for the second PSI5 communications interface 12', which includes a resistor 40 within the return path thereof. The resistor 40 may be a discrete device as shown in the schematic of FIG. 1B. However, the resistor 40 may take other forms, such as a resistance effect of an electronic device. The resistance value R1 of the resistor 40 is a tradeoff between voltage drop, and corresponding power loss, and electromagnetic (EM) emissions reduction. The resistance value R1, may be 0.5 to 20Ω, although any value may be used. In some embodiments, the resistor 40 has a resistance value R1 of 5Ω.

The second PSI5 communications interface 12' uses PSI5 timing compliance and PSI5 differential current for data communications and for synchronization, but with balancing of voltages on the two-wire interconnection 16. This voltage balancing is illustrated on FIG. 3B and discussed further, below. Like the first ECU 10, the second ECU 10' may be used as a restraint control module to monitor and/or control sensors and/or actuators in a restraint system of a motor vehicle. The second ECU 10' may also be used in other applications, such as in an engine control module (ECM), body control module (BCM), powertrain control module (PCM), etc.

Figure 2A:
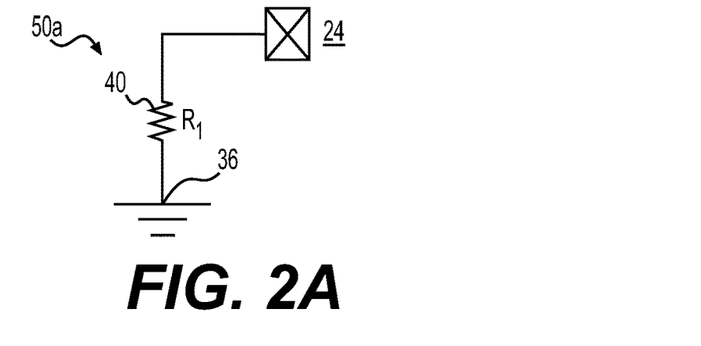
FIG. 2A shows a first example impedance balancing and damping circuit of a PSI5 communications interface according to aspects of the present disclosure.

FIG. 2A shows a first example impedance balancing and damping circuit 50a of a PSI5 communications interface according to aspects of the present disclosure. The first example balancing circuit 50a is identical to the balancing circuit used in the second PSI5 communications interface 12' of FIG. 1B, with a discrete resistor 40 connected between the second signal terminal 24 and the chassis ground 36.

Figure 2B:
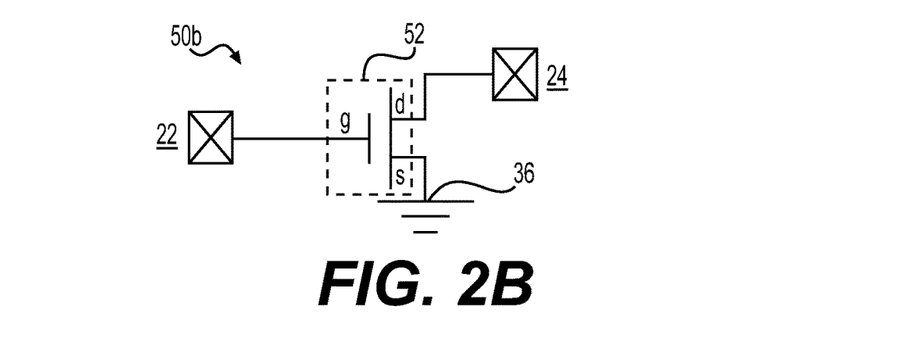
FIG. 2B shows a second example impedance balancing and damping circuit of a PSI5 communications interface according to aspects of the present disclosure.

FIG. 2B shows a second example impedance balancing and damping circuit 50b of a PSI5 communications interface according to aspects of the present disclosure. The second example balancing circuit 50b includes a field effect transistor (FET) 52 configured to function as an active resistor. Specifically, the FET 52 includes a drain terminal d, a source terminal s, and a gate terminal g. The drain terminal d is connected to the second signal terminal 24, and the source terminal s is connected to the chassis ground 36. The gate terminal g is connected to the first signal terminal 22. The FET 52 defines a drain-source on resistance Rds_on between the drain terminal d and the source terminal source terminal s when the gate terminal g is above a threshold voltage. The FET 52 may be configured such that the drain-source on resistance Rds_on is equal to the desired resistance value R1.

Figure 2C:
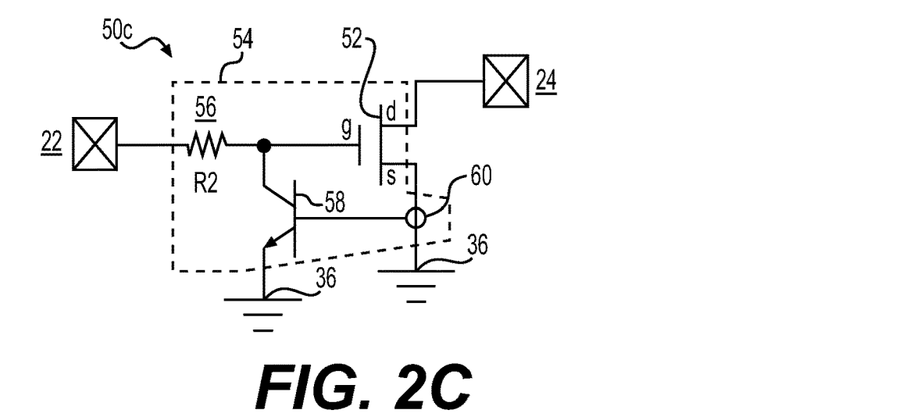
FIG. 2C shows a third example impedance balancing and damping circuit of a PSI5 communications interface according to aspects of the present disclosure.

FIG. 2C shows a third example impedance balancing and damping circuit 50c of a PSI5 communications interface according to aspects of the present disclosure. The third example impedance balancing and damping circuit 50c is similar to the second example impedance balancing and damping circuit 50b shown in FIG. 2B with some additional components to provide current protection. The third example impedance balancing and damping circuit 50c also includes a FET 52 that defines the resistor as a drain-source on resistance Rds_on between the second signal terminal 24 and the ground 36.

The third example impedance balancing and damping circuit 50c may withstand application of a given voltage, such as 12 VDC, to the second signal terminal 24, where the same given voltage could damage other, unprotected, balancing circuits. Such current protection may be required to satisfy OEM requirements. More specifically, the third example impedance balancing and damping circuit 50c includes a current limiting circuit 54 having a current limiting resistor 56 connected between the gate terminal g of the FET 52 and the first signal terminal 22. The current limiting resistor 56 has a second resistance value R2, which may have a relatively high resistance value, such as 1 kΩ or greater. The current limiting resistor 56 may have a different resistance value, and the resistance value may depend on details of the design, such as the nominal voltage on the second signal terminal 24. A switch 58 is configured to limit an amount of current between the second signal 24 terminal and a ground 36. The switch 58 is shown as a junction transistor in FIG. 2C, however, other switching devices, such as a FET, a Triac, or a SCR could be used as the switch 58. A current sensor 60 is configured to detect the amount of current between the second signal terminal 24 and the ground 36. The current sensor 60 is shown between the FET 52 in FIG. 2C; however, the current sensor 60 may be connected elsewhere in the current path, such as between the second signal terminal 24 and the FET 52. The switch 58 is controlled by the current sensor 60 to selectively assert or de-assert a control voltage upon the gate of the FET 52 to drive the FET 52 between a low impedance state and a high impedance state. More specifically, the switch 58 is controlled by the current sensor 60 to selectively short-circuit the gate terminal g of the FET 52 to ground in response to detecting a current above a threshold current value, thereby driving the FET 52 to an OFF condition with a high impedance between the drain terminal d and the source terminal s. When the current is below the threshold current value, the switch 58 is in an open-circuit condition, with the gate terminal g of the FET 52 not connected to ground. In this state, the gate terminal g of the FET 52 is pulled-up to the asserted control voltage by current from the first signal terminal 22 through the current limiting resistor 56. For this reason, the current limiting resistor 56 may also be called a pull-up resistor.

Figure 2D:
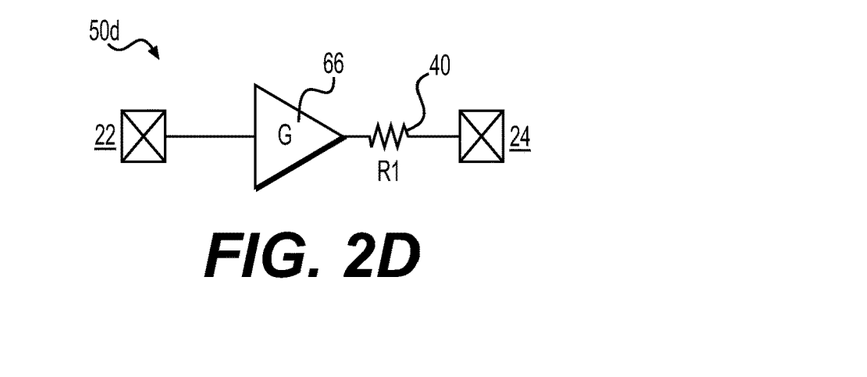
FIG. 2D shows a fourth example impedance balancing and damping circuit of a PSI5 communications interface according to aspects of the present disclosure.

FIG. 2D shows a fourth example impedance balancing and damping circuit 50d of a PSI5 communications interface according to aspects of the present disclosure. Specifically, the fourth example balancing circuit 50d includes a signal amplifier 66 having a signal input coupled to the first signal terminal 22 and a signal output coupled to the second signal terminal 24 through the resistor 40. The signal amplifier 66 may function as a complex drive to generate a voltage upon the second signal terminal 24 that is inversely proportional to a voltage on the first signal terminal 22. These voltages are illustrated graphically on FIG. 3B, and discussed below.

Figure 3A:
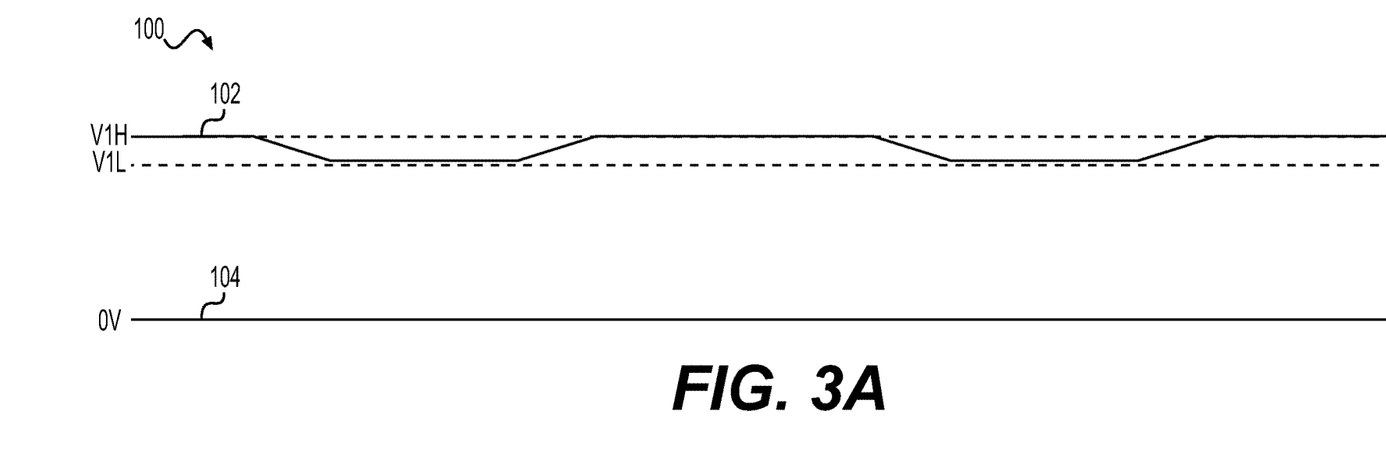
FIG. 3A is a graph showing plots of voltages on a conventional PSI5 communications interface.

FIG. 3A is a first graph 100 including plots 102, 104 of voltages on a conventional PSI5 communications interface. The plots 102, 104 shown on FIG. 3A may be produced, for example, by the first PSI5 communications interface 12 shown in FIG. 1A. Specifically, the first graph 100 includes a first plot 102 of voltages upon the first signal terminal 22 of the first PSI5 communications interface 12. The first plot 102 shows the voltages upon the first signal terminal 22 varying between a first high voltage V1H and a first low voltage V1L that is less than the first high voltage V1H. These changing voltages correspond to different current driving signals of the PSI5 standard. The first graph 100 also includes a second plot 104 of voltages upon the second signal terminal 24 of the first PSI5 communications interface 12. The voltage upon the second signal terminal 24, as shown in the second plot 104, is held at a 0 Volt state as a result of the second signal terminal 24 being connected to the chassis ground 36 in the first PSI5 communications interface 12. These waveforms of the first and second plots 102, 104 may be referred to as being unbalanced, with a change a voltage on one of the signal terminals 22, 24 not having a corresponding voltage change on the other one of the signal terminals.

Figure 3B:
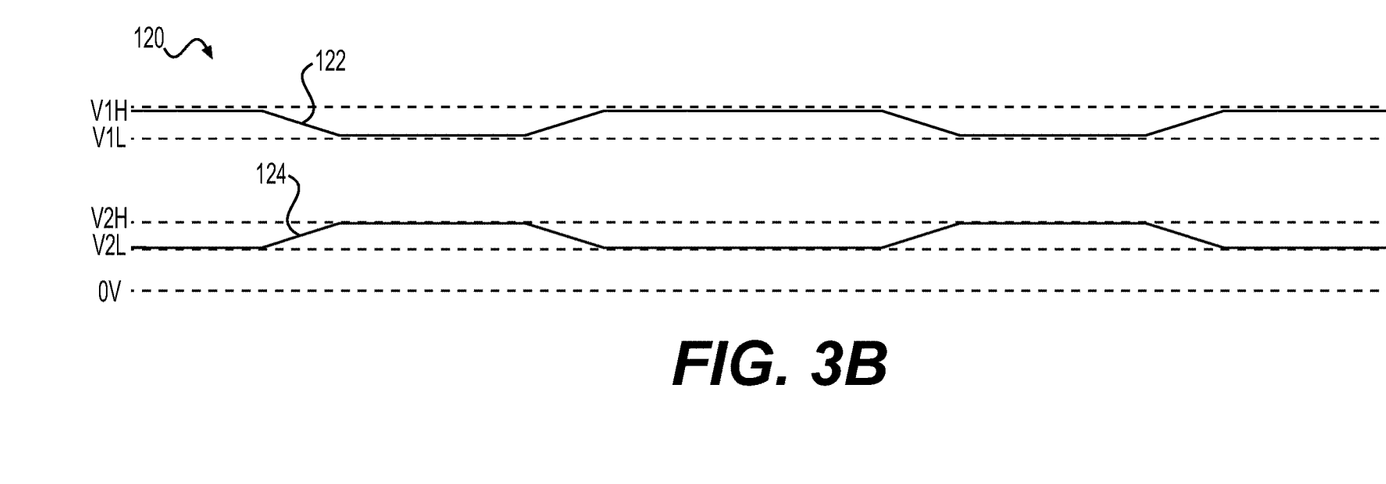
FIG. 3B is a graph showing plots of voltages on a PSI5 communications interface according to aspects of the present disclosure.

FIG. 3B is a second graph 120 including plots 122, 124 of voltages on a PSI5 communications interface in accordance with the present disclosure. The plots 122, 124 shown on FIG. 3B may be produced, for example, by the second PSI5 communications interface 12' shown in FIG. 1B. Specifically, the second graph 120 includes a third plot 122 of voltages upon the first signal terminal 22 of the second PSI5 communications interface 12'. The second plot 122 shows the voltages upon the first signal terminal 22 varying between approximately the first high voltage V1H and the first low voltage V1L. These changing voltages correspond to different current driving signals of the PSI5 standard.

The second graph 120 also includes a fourth plot 124 of voltages upon the second signal terminal 24 of the second PSI5 communications interface 12'. The fourth plot 124 shows the voltages upon the second signal terminal 24 varying between a second high voltage V2H and a second low voltage V2L that is less than the second high voltage V2H, but still greater than 0 V. Both the second high and low voltages V2H, V2L are less than the first low voltage V1L. The voltages on the second signal terminal 24, as shown on the fourth plot 124, are a mirror image of the voltages on the first the voltages upon the first signal terminal 22, as shown on the third plot 122. These waveforms of the third and fourth plots 122, 124 may be referred to as being balanced, with a change a voltage on one of the signal terminals 22, 24 having a corresponding and offsetting voltage change on the other one of the signal terminals. Such balanced signals may generate lower amounts of electromagnetic interference (EMI) than similar unbalanced signals.

The voltages upon the first signal terminal 22 of the second PSI5 communications interface 12', as shown in the third plot 122, may be slightly less than the corresponding voltages upon the first signal terminal 22 of the first PSI5 communications interface 12, as shown in the first plot 102, as a result of higher impedance due to the presence of the resistor 40 in the return path.

Figure 4:
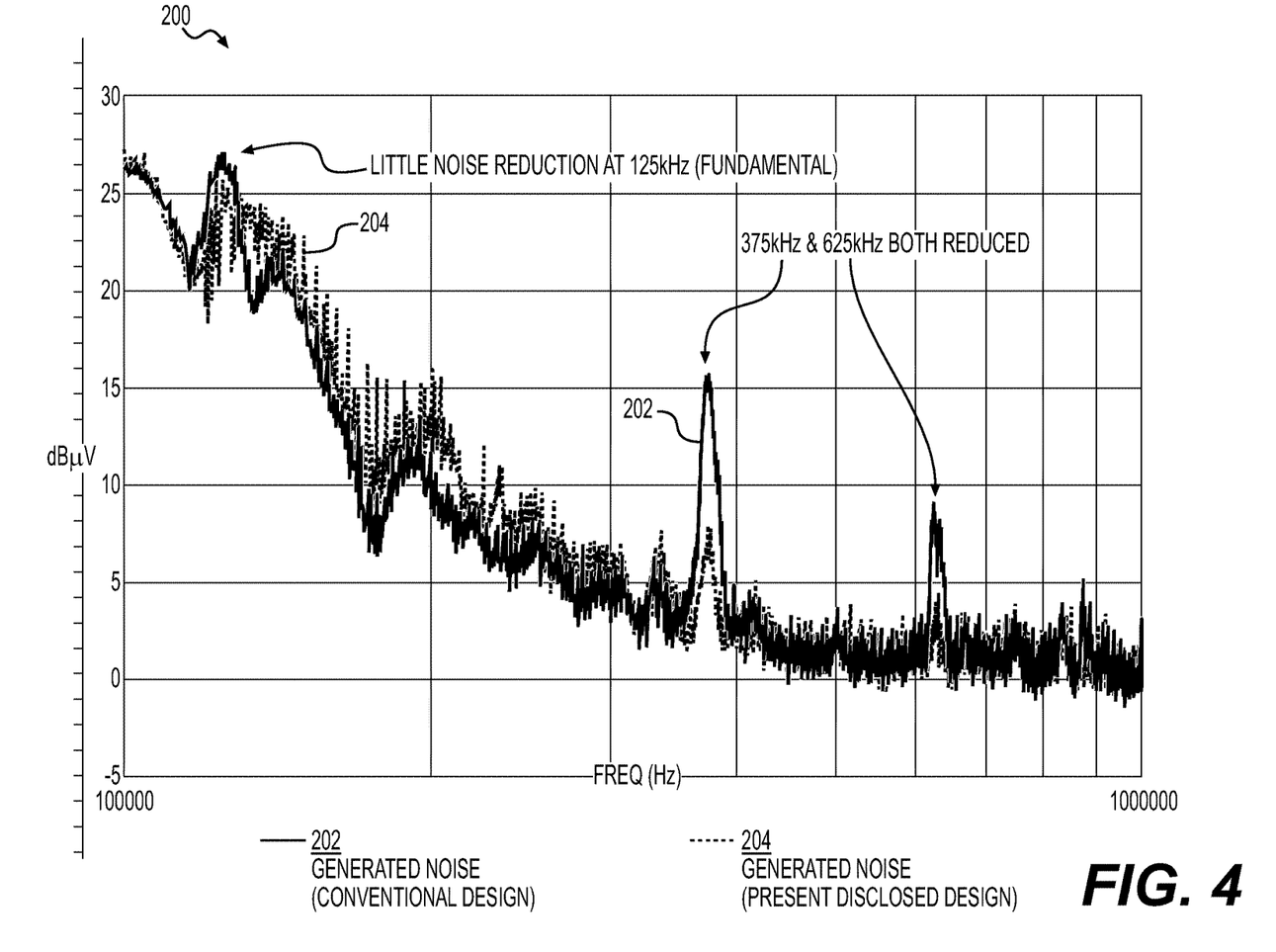
FIG. 4 shows a graph of EMI noise as a function of frequency for both a conventional PSI5 communications interface and a PSI5 communications interface constructed in accordance with the present disclosure.

FIG. 4 shows a graph 200 of EMI noise as a function of frequency for both a conventional PSI5 communications interface and a PSI5 communications interface constructed in accordance with the present disclosure. Specifically, graph 200 includes a first noise plot 202 showing amounts of EMI noise produced by the first PSI5 communications interface 12 and a two-wire interconnection 16 connected thereto. Graph 200 also includes a second noise plot 204 showing amounts of EMI noise produced by the second PSI5 communications interface 12' and a two-wire interconnection 16 connected thereto. Each of the noise plots 202, 204 show noise level (dBμV) as a function of frequency (Hz). Note that the noise plots 202, 204 are approximately equal at a 125 kHz fundamental frequency, but that the noise plots 202, 204 show substantially less noise produced by the second PSI5 communications interface 12' at 375 kHz (the $3^{rd}$ harmonic of 125 kHz fundamental frequency) and 625 kHz (the $5^{th}$ harmonic of 125 kHz fundamental frequency) when compared with the noise produced by the first PSI5 communications interface 12 at those same frequencies. The impedance balancing and damping circuit is responsible for the noise reduction seen at the spectral frequencies of 375 kHz and 625 kHz A method for operating a PSI5 communications interface 12' of an electronic control unit 10' is also provided. The method comprises the steps of: applying a signal voltage to a first signal terminal 22 of the PSI5 communications interface 12' to drive a signal current to a remote sensor 14 via a two-wire interconnection 16; receiving the signal current from the remote sensor 14 by a second signal terminal 24 of the PSI5 communications interface 12' providing a return path for the signal current; and inducing a balance voltage upon the second signal terminal 24 by a resistor within the return path.

In some embodiments, the PSI5 communications interface 12' has PSI5 timing compliance. The PSI5 communications interface 12' may use PSI5 differential current for data communications and for synchronization, but with balancing of voltages on the two-wire interconnection 16. In some embodiments, the electronic control unit 10' is configured for operation within a restraint control module for a motor vehicle. For example, the electronic control unit 10' may function to facilitate communications between the restraint control module and one or more remote devices, such as sensors and/or actuators.

In some embodiments, the resistor 40 is a discrete resistor device. In some embodiments, the resistor 40 is connected between the second signal terminal 24 and a chassis ground 36. One example of such a discrete resistor device 40 that is connected between the second signal terminal 24 and the chassis ground 36 is shown in the first example impedance balancing and damping circuit 50a of FIG. 1A.

In some embodiments, the resistance of the resistor 40 is selectively changed as a function of the signal voltage. For example, the PSI5 communications interface 12' may include circuitry to change the effective resistance in the return path for the signal current. Examples of an active circuit for changing the effective resistance in the return path for the signal current as a function of the signal voltage are shown in in the second and third example impedance balancing and damping circuits 50b, 50c of FIGS. 2B and 2C, respectively.

In some embodiments, the resistor 40 is defined by a drain-source on resistance Rds_on of a field effect transistor 52. Furthermore, in some embodiments, selectively changing the resistance of the resistor 40 further comprises selectively asserting or applying a voltage to a gate g of the field effect transistor 52 by the signal voltage. The voltage applied to the gate g of the field effect transistor 52 may be the signal voltage upon the first signal terminal 22, or a voltage generated as a function of the signal voltage.

In some embodiments, the method further comprises sensing the signal current; and driving the return path to a high-impedance state in response to the signal current exceeding a current threshold voltage. One example of such a current limiting arrangement is shown in FIG. 2C. In that example arrangement, the resistor is defined by a drain-source on resistance of a field effect transistor Rds_on of a field effect transistor 52, and the return path is driven to the high-impedance state by selectively de-asserting a gate g of the field effect transistor 52 in response to the signal current exceeding the current threshold voltage. These method steps may be accomplished using a different combination of hardware and/or software from the example circuit shown in the third example impedance balancing and damping circuit 50c of FIG. 2C.

In some embodiments, inducing the balance voltage upon the second signal terminal 24 further comprises applying a bias signal to the second signal terminal 24 by a signal amplifier 66, with the bias signal being a function of the signal voltage. An example of an active complex drive that employs a signal amplifier 66 to apply the bias signal to the second signal terminal 24 is shown in the fourth example impedance balancing and damping circuit 50d of FIG. 2D.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate in scope with the present disclosure. Additionally, while various embodiments of the present disclosure have been described, it is to be understood that aspects of the present disclosure may include only some of the described embodiments or combinations of the various embodiments. Accordingly, the present disclosure is not to be seen as limited by the foregoing description.

What is claimed is:

1. An electronic control unit comprising:
   a Peripheral Sensor Interface 5 (PSI5) communications interface configured to communicate with a remote sensor using a current-modulated signal with PSI5 compliance upon a two-wire interconnection, the PSI5 communications interface including:
      a signal driver configured to apply a signal voltage to a first signal terminal for driving current to the remote sensor via the two-wire interconnection;
      a second signal terminal providing a return path for the current; and
      a resistor within the return path of the PSI5 communications interface to induce a balance voltage on the second signal terminal, wherein the balance voltage has a magnitude corresponding to a magnitude of the signal voltage and an opposite polarity thereof, and wherein the resistor is defined by a drain-source on resistance of a field effect transistor having a gate terminal connected to the first signal terminal.

2. A restraint control module for a motor vehicle comprising the electronic control unit of claim 1.

3. The electronic control unit according to claim 1, wherein the resistor is connected between the second signal terminal and a chassis ground.

4. The electronic control unit according to claim 1, wherein the gate terminal is connected directly to the first signal terminal of the PSI5 communications interface.

5. The electronic control unit according to claim 4, further comprising a current limiting resistor connected between the gate terminal and the first signal terminal of the PSI5 communications interface.

6. An electronic control unit comprising:
   a Peripheral Sensor Interface 5 (PSI5) communications interface configured to communicate with a remote sensor using a current-modulated signal with PSI5 compliance upon a two-wire interconnection, the PSI5 communications interface including:
      a signal driver configured to apply a signal voltage to a first signal terminal for driving current to the remote sensor via the two-wire interconnection;
      a second signal terminal providing a return path for the current;
      a resistor within the return path of the PSI5 communications interface to induce a balance voltage on the second signal terminal, wherein the balance voltage has a magnitude corresponding to a magnitude of the signal voltage and an opposite polarity thereof, and wherein the resistor is defined by a drain-source on resistance of a field effect transistor; and
      a switch configured to limit an amount of current between the second signal terminal and a ground.

7. The electronic control unit according to claim 6, further comprising a current sensor configured to detect the amount of current between the second signal terminal and the ground; and
   wherein the switch is controlled by the current sensor.

8. The electronic control unit according to claim 6,
   wherein the switch is configured to selectively assert or de-assert a control voltage upon a gate of the field effect transistor to drive the field effect transistor between a low impedance state and a high impedance state.

9. The electronic control unit according to claim 1, further comprising a signal amplifier having a signal input and a signal output, with the signal input coupled to the first signal terminal and the signal output coupled to the second signal terminal through the resistor.

10. A method for operating a Peripheral Sensor Interface 5 (PSI5) communications interface of an electronic control unit, the method comprising:
applying a signal voltage to a first signal terminal of the PSI5 communications interface to drive a signal current to a remote sensor via a two-wire interconnection;
receiving the signal current from the remote sensor by a second signal terminal of the PSI5 communications interface providing a return path for the signal current;
inducing a balance voltage upon the second signal terminal by a resistor within the return path, wherein the balance voltage has a magnitude corresponding to a magnitude of the signal voltage and an opposite polarity thereof, and wherein the resistor is defined by a drain-source on resistance of a field effect transistor; and
selectively changing a resistance of the resistor as a function of the signal voltage.

11. The method according to claim 10, wherein the electronic control unit is configured for operation within a restraint control module for a motor vehicle.

12. The method according to claim 10, wherein the resistor is connected between the second signal terminal and a chassis ground.

13. The method according to claim 10, wherein selectively changing the resistance of the resistor further comprises selectively asserting a gate of the field effect transistor by the signal voltage.

14. The method according to claim 10, further comprising:
sensing the signal current; and
driving the return path to a high-impedance state in response to the signal current exceeding a current threshold voltage.

15. The method according to claim 14, wherein driving the return path to the high-impedance state further comprises selectively de-asserting a gate of the field effect transistor in response to the signal current exceeding the current threshold voltage.

16. The method according to claim 10, wherein inducing the balance voltage upon the second signal terminal further comprises:
applying a bias signal to the second signal terminal by a signal amplifier, with the bias signal being a function of the signal voltage.

* * * * *